US006338629B1

(12) United States Patent
Fisher et al.

(10) Patent No.: US 6,338,629 B1
(45) Date of Patent: Jan. 15, 2002

(54) ELECTRICAL CONNECTING DEVICE

(75) Inventors: Gil Fisher, Petach Tikva; Eyal Gargir, Kfar Saba; Roni Mor, Tsur Yigal; Oded Savarov, Hod Hasharon, all of (IL)

(73) Assignee: Aprion Digital Ltd., Netanya (IL)

( * ) Notice: Subject to any disclaimer, the term of this patent is extended or adjusted under 35 U.S.C. 154(b) by 0 days.

(21) Appl. No.: 09/372,463

(22) Filed: Aug. 11, 1999

(30) Foreign Application Priority Data

Mar. 15, 1999 (IL) ............................................... 128997

(51) Int. Cl.[7] .......................... H01R 12/00; H05K 1/00
(52) U.S. Cl. ........................................... 439/66; 439/91
(58) Field of Search ..................................... 439/66, 91

(56) References Cited

U.S. PATENT DOCUMENTS 3,904,934 A * 9/1975 Martin ................... 317/101 D
3,998,513 A 12/1976 Kobayashi et al.
4,729,166 A 3/1988 Lee et al.
4,991,290 A 2/1991 MacKay
4,993,958 A 2/1991 Trobough et al.
5,037,311 A * 8/1991 Frankeny et al. ............. 439/66
5,092,774 A 3/1992 Milan
5,101,553 A 4/1992 Carey
5,109,596 A * 5/1992 Driller et al. ................. 29/705
5,174,763 A * 12/1992 Wilson ........................ 439/66
5,274,917 A 1/1994 Corbett, III et al.
5,331,514 A * 7/1994 Kuroda ....................... 361/760
5,380,210 A * 1/1995 Grabbe et al. ................ 439/66
5,380,212 A 1/1995 Smeegne, Jr. et al.
5,384,492 A * 1/1995 Carlson et al. ............. 307/147
5,397,240 A * 3/1995 Herard ........................ 439/66
5,473,510 A * 12/1995 Dozier, II .................... 439/66
5,474,458 A * 12/1995 Vafi et al. ..................... 439/91
5,509,203 A * 4/1996 Yamashita .................. 439/91
5,599,193 A 2/1997 Crotzer
5,746,608 A * 5/1998 Taylor ......................... 439/70
5,785,538 A * 7/1998 Beaman et al. ............... 439/91
5,810,607 A * 9/1998 Shih et al. .................... 439/66
6,006,298 A * 12/1999 Satoh ......................... 710/103
6,042,387 A * 3/2000 Jonaidi ........................ 439/66
6,056,557 A * 5/2000 Crotzer et al. ................ 439/66

OTHER PUBLICATIONS

Shin–Etsu–Commercial Publications, No Date.

* cited by examiner

*Primary Examiner*—Brian Sircus
*Assistant Examiner*—Hae Moon Hyeon
(74) *Attorney, Agent, or Firm*—Eitan, Pearl, Latzer & Cohen-Zedek

(57) ABSTRACT

An electrical connecting device for electrically connecting a multitude of electrical contacts, which are placed on first and second electronic component carrying boards. The device includes an isolating board having a plurality of apertures formed therein, electrically conductive elements placed within each of the plurality of apertures and extending therethrough on either side of the isolating board. Each of the electrically conductive elements separated and isolated one from the other. The electrically conductive elements are brought into contact with respective electrical contacts on the first and second boards.

8 Claims, 6 Drawing Sheets

F F F 52 54 56 40 41 40 18 56 58 42 42 16 58 24 22 14 16 32 24 12 10 46 22 50 50 36 44 48 20 48

ELECTRICAL CONNECTING DEVICE

FIELD OF THE INVENTION

This invention relates in general to electrical connect devices and in particular, to a connector between electrical drivers on one plane and actuators on a second plane.

BACKGROUND OF THE INVENTION

Connecting means between contact points on two planes are known in the electronics industry. For example, connection between two printed circuits or connection between an integrated circuit (IC) under test and the circuit connecting it for electrical checking.

Recent developments in this field include increasing the quantity and the density of electrical contacts so as to prevent an increase in the size of the electrical system containing these elements. U.S. Pat. Nos. 5,380,212 and 5,092,774 describe connectors, which are suitable for use where there is a high density of connectors.

For example, U.S. Pat. No. 5,380,212 to Smeenge Jr. et al. describes an electrical interface which includes an elastomer holder having a plurality of holes containing elastomer conductors. U.S. Pat. No. 5,092,774 describes an electrical connector which provides mechanical coupling and an electrical interface between circuit boards.

The above prior art references are not suitable where there are a large number of electrical connections which must be accuracy and precisely located and where the total size of the contact area is small in comparison to the board size (low density).

U.S. Pat. No. 5,599,193 to Crotzer describes an electrical interconnect method for interconnecting two printed circuit boards, for example, which provides a possible solution to this problem. However, the connector is complicated to manufacture.

SUMMARY OF THE PRESENT INVENTION

The present invention provides an improved electrical connector between contact points on two separate planes, such as circuit boards or other electronic components.

There is thus provided, in accordance with a preferred embodiment of the present invention, an electrical connecting device for electrically connecting a multitude of electrical contacts, which are placed on first and second electronic component carrying boards. The device includes an isolating board having a plurality of apertures formed therein, electrically conductive elements placed within each of the plurality of apertures and extending therethrough on either side of the isolating board. Each of the electrically conductive elements separated and isolated one from the other. The electrically conductive elements are brought into contact with respective electrical contacts on the first and second boards.

Furthermore, in accordance with a preferred embodiment of the present invention, the isolating board further includes a pair of outer conducting elements, located on either end of said electrically conductive elements proximate to the outer conducting elements. The pair of outer conducting elements are larger than said electrically conductive elements.

Additionally, the isolating board also includes a pair of placement apertures located proximate to the outer edges of the isolating board. The pair of placement apertures being dimensionally configured to slidingly receive a corresponding pair of placement pins attached to the second board.

Furthermore, in accordance with a preferred embodiment of the present invention, the first board includes a second pair of placement apertures located proximate to the outer edges of the first board, the second pair of placement apertures being dimensionally configured similar to the first pair of placement apertures to slidingly receive the corresponding pair of placement pins attached to the second board.

In addition, in accordance with a preferred embodiment of the present invention, each of said electrically conductive elements includes an integrally molded element having a generally conical shape having upper and lower truncated cone portions. The upper cone portion has a base having a diameter d1 and an upper contact area having a diameter d2 and wherein the lower cone has a second base having a diameter d3 and a lower contact area having a diameter d4, the plurality of apertures having a diameter W. W<d4 and W<d3.

Furthermore, in accordance with a preferred embodiment of the present invention, each of the electrically conductive elements includes a spring loaded element having contracts on either side. Alternatively, each of the electrically conductive elements includes a dual leaf spring element having contacts on either side.

Additionally, in accordance with a preferred embodiment of the present invention, the first and second boards are brought into contact via the connecting device by application of a pressure plate applied to the first board. The overall dimensions of the pressure plate are at least equivalent to the overall dimensions of the first board. The pressure plate includes a flexible and heat conducting element suitably attached to the side thereof proximate to the first board.

DETAILED DESCRIPTION OF THE INVENTION

Figure 1:
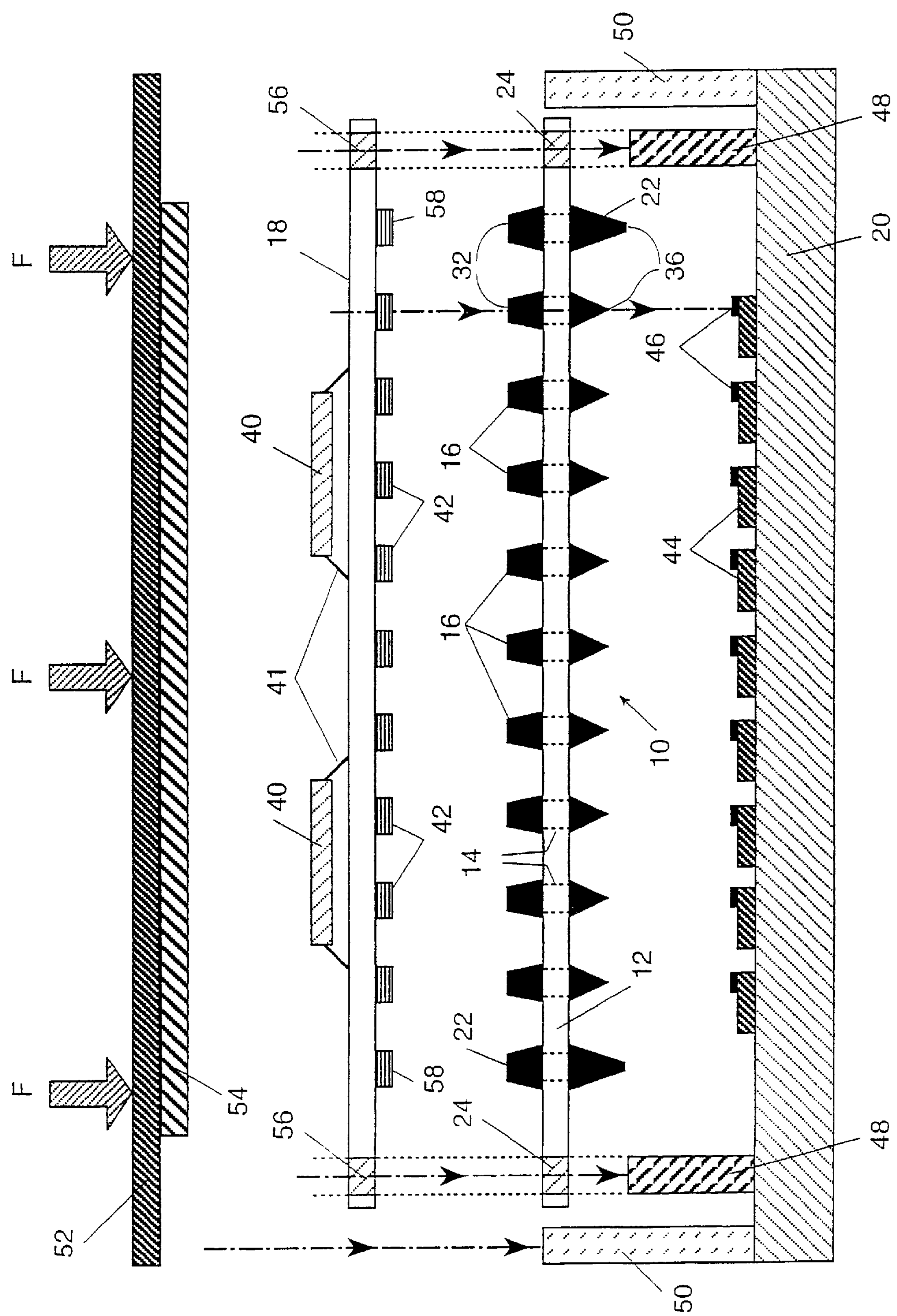
FIG. 1 is an exploded elevational view of a connecting device, constructed and operative according to a preferred embodiment of the present invention.

Reference is made to FIG. 1, which is an exploded elevational view of a connecting device, generally designated 10, constructed and operative according to a preferred embodiment of the present invention.

Connecting device 10 comprises an isolating board 12 having a plurality of apertures 14 formed therein. A plurality of conductive elements 16 are molded within each of the apertures 14, each of the conductive elements 16 extending either side of the isolating board 12.

The conductive elements 16, which are isolated one from the other, act as the contact makers between boards, for example, which require to be electrically connected together. Connecting device 10, illustrated in the exemplary embodiment of FIG. 1, is located between a printed circuit board 18 and a series of actuators 44 mounted on a metallic ground plate 20.

Isolating board 12, which may be constructed of any suitable insulation material, such as, for example, "Thermount" manufactured by Arion Inc., USA, further comprises a plurality of conducting elements 22 and placement apertures 24. Placement apertures 24 are located proximate to the outer edges of the board 12. Conducting elements 22 are similar to conductive elements 16 being integrally molded with the isolating board 12, and are located on either end of the plurality of conductive elements 16, proximate to conducting elements 22.

Figure 2:
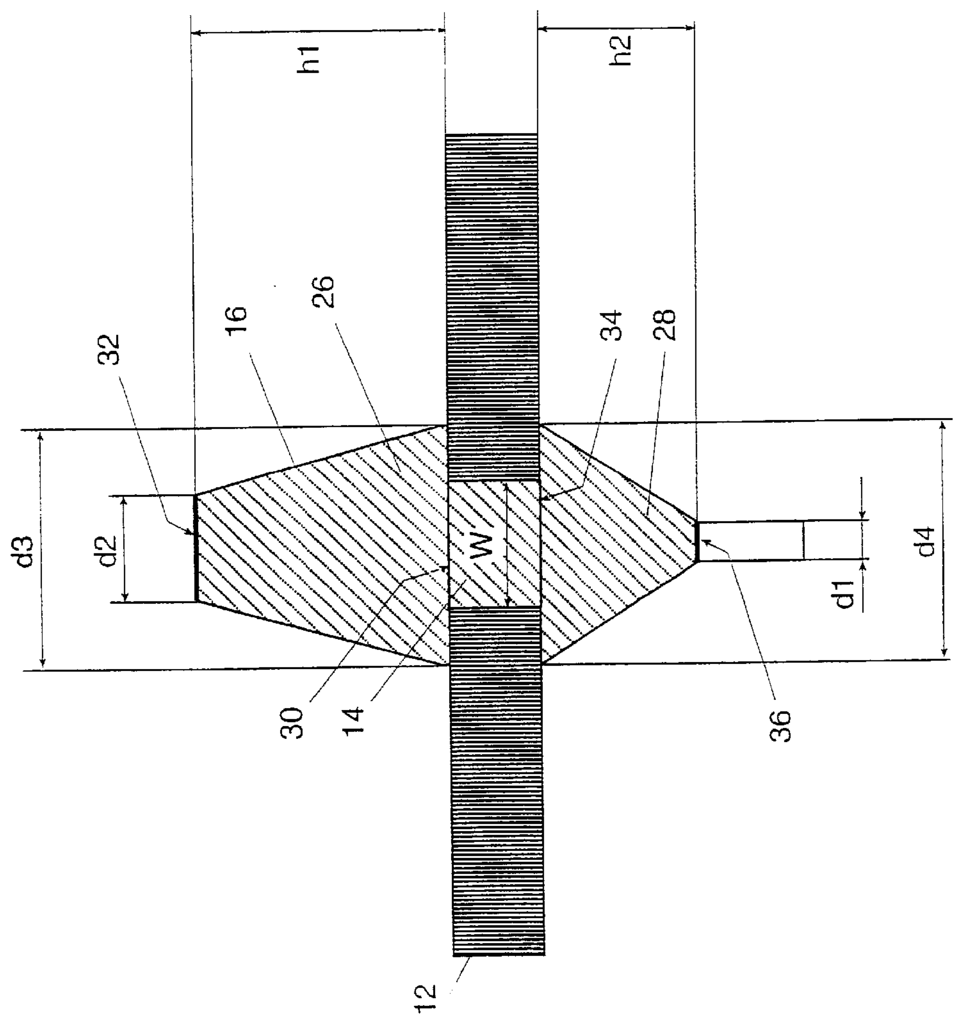
FIG. 2 is an enlarged detail of the conductive element of the connecting device of FIG. 1.

Reference is now also made to FIG. 2, which is an enlarged detail of part of the isolating board 12 illustrating the conductive element 16. Each conductive element 16 consists of an integrally molded element having a generally conical shape. Conductive element 16 comprises upper and lower truncated cone portions 26 and 28, respectively, which make contact to printed circuit board 18 and the actuators 44 mounted on metallic ground plate 20, respectively.

FIG. 2 illustrates the preferred dimensional structure of conductive elements 16. Apertures 14 are circular having a diameter W. Upper cone 26 has a height h1, a base 30 having a diameter d3 and an upper contact area 32 having a diameter d2. Lower cone 28 has a height h2, a base 34 having a diameter d4 and a lower contact area 36 having a diameter d1.

In order that the conductive elements 16 are secured in place, the following relationship should be maintained: W<d4, W<d3.

In an exemplary embodiment, isolating board 12 is 0.8 mm thick. The exemplary dimensions of the corresponding conductive elements 16, are as follows: W=1.5 mm, h1=1.4 mm, h2=1.2 mm, d=0.25 mm, d2=0.8 mm, d3=2.0 mm and d4=2.0 mm.

Figure 3:
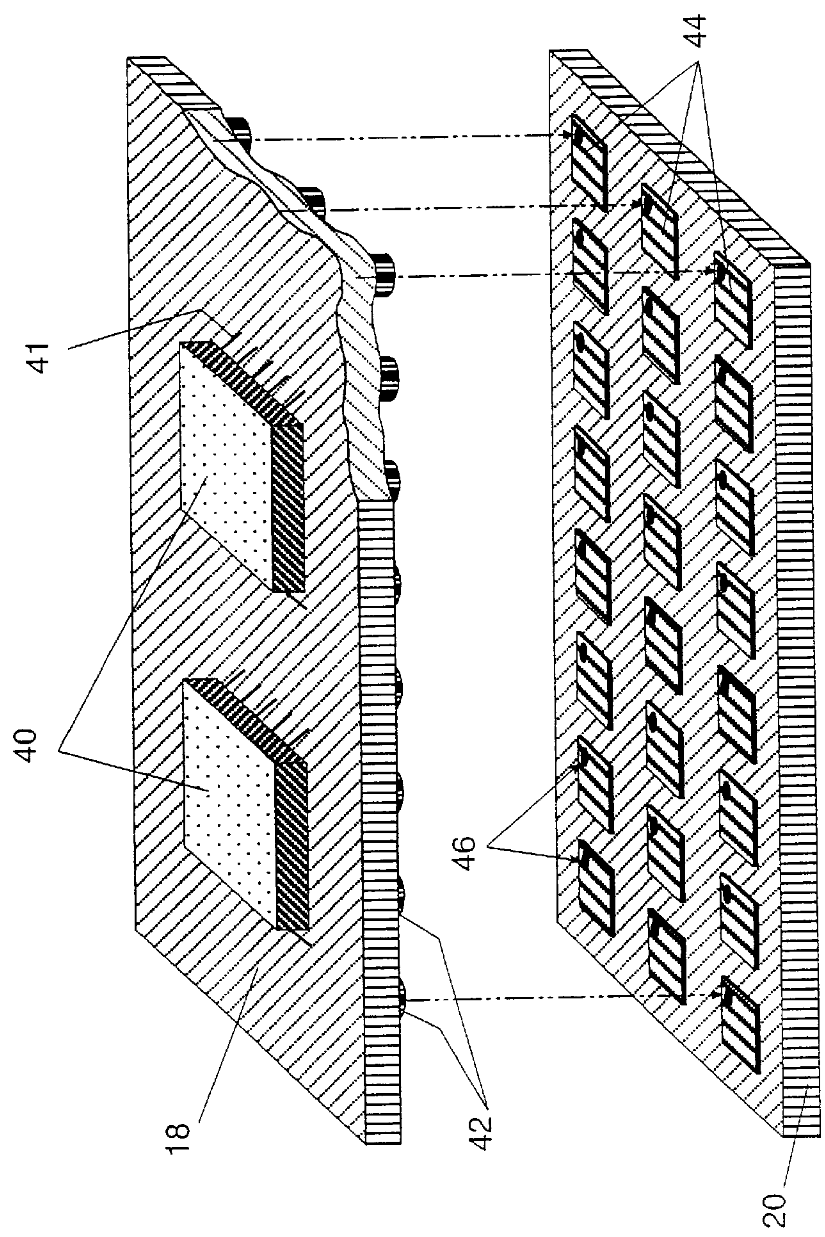
FIG. 3 is an isometric illustrative example of first and second boards, which may be electrically connected together by connecting device of FIG. 1.

Reference is now also made to FIG. 3, which is an isometric illustration of the components of printed circuit board 18 and the actuators 44 mounted on metallic ground plate 20.

Printed circuit board 18 comprises a plurality of drivers 40 mounted on the upperside of printed circuit board 18 and a plurality of contact pads 42 on the underside of printed circuit board 18, to which drivers 40 are connected.

Generally, each driver 40 comprises leads or pads 41, which are connected via a conductor (not shown) to contact pads 42.

Printed circuit board 18 further comprises secondary placement apertures 56 (FIG. 1) located proximate to the outer edges of thereof and outer ground contact elements 58 (FIG. 1). Outer ground contact elements 58 are similar to contact pads 42. Elements 56, 58 are shown in FIG. 1 but not in FIG. 3.

A plurality of actuators 44, arranged in a bi-dimensional array; are mounted on ground plate 20 each of actuators 44 having its own actuator contact pads 46. Actuators 44 may be any suitable electrical element such as piezo-electrical actuators.

The negative polarity of each of the actuators 44 is in contact with the metallic ground plate 20, which acts as an earth conductor. The actuators 44 are activated by an electrical pulse generated from the drivers 40 via the printed circuit contact pads 42 and actuator contact pads 46.

Metallic ground plate 20 further comprises placement pins 48 and frame supports 50. (FIG. 1) Both placement pins 48 and frame supports 50 are integrally connected with the metallic ground plate 20.

Placement pins 48 are dimensionally configured to be slidingly insertable within placement apertures 24 of isolating board 12 and secondary placement apertures 56 of printed circuit board 18.

Thus, by inserting placement pins 48 into the placement apertures 24, the lower contact area 36 of conductive element 16 can be precisely placed on actuator contact pads 46. Similarly, by inserting placement pins 48 into the secondary placement apertures 56, the upper contact area 32 of conductive element 16 can be precisely located to contact pads 42.

The height h2' of the lower cone of the conducting elements 22 is greater than height h2 of the standard lower cone 28 of conductive elements 16.

Actuators 44 are not placed directly under ground conducting elements 22 so that the longer lower cone of conducting elements 22 makes direct contact with the metallic ground plate 20. Thus, the ground circuit to all the actuators is closed simultaneously.

In order to achieve good contact between the various contact points, a pressure plate 52 (FIG. 1) is used. The pressure plate 52 comprises a flexible and heat conducting element 54 suitably attached to one side thereof. The overall dimensions of pressure plate 52 are at least equivalent to the overall dimensions of the metallic ground plate 20.

Element 54 is used for conducting heat created from the drivers 40 to the pressure plate 52. Element 54 also compensates for variations in the height of drivers 40. In practice, pressure is applied to the upper surface of pressure plate 52 (indicated by arrows F) until it makes contact with the frame supports 50 of metallic ground plate 20.

The force required to create a satisfactory contact for a single conductive element 16 is approximately 10 to 20 grams, for example. Thus, assuming an average force of 15 grams per conductive element 16, the required force is approximately 15 Kg. for an array of 1000 conductive elements 16. The parameters which determine the required force for compressing the contact element 16, include its geometrical characteristics and the elasticity properties of the material it is made of.

The conductivity of the contact element 16 is also dependent on the material it is made of. For example, moldable elastomeric materials including conducting particles such as "CONSIL-C" manufactured by Tecknit of Cramford, N.J. U.S.A, or similar can conduct up to 0.5 ampere with a resistance of less than one tenth of an Ohm.

Pressuring this type of elastomeric material creates contact between the metal particles within the material and enables electrical conductivity from the upper contact plane 32 to the lower contact plane 36. The quality of the conductivity is dependent upon the pressuring and the type of the metal particles.

Figure 4A:
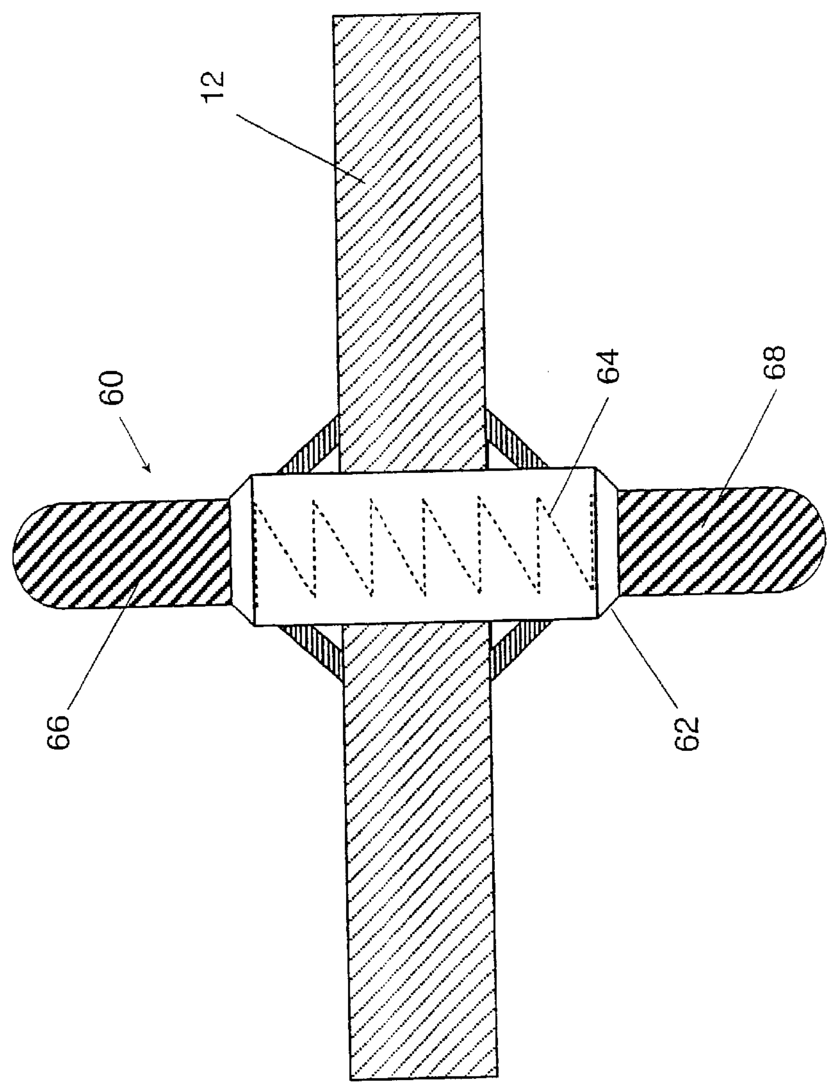
FIGS. 4A–4C illustrate various alternative embodiments of the conductive element of FIG. 1.
Figure 4B:
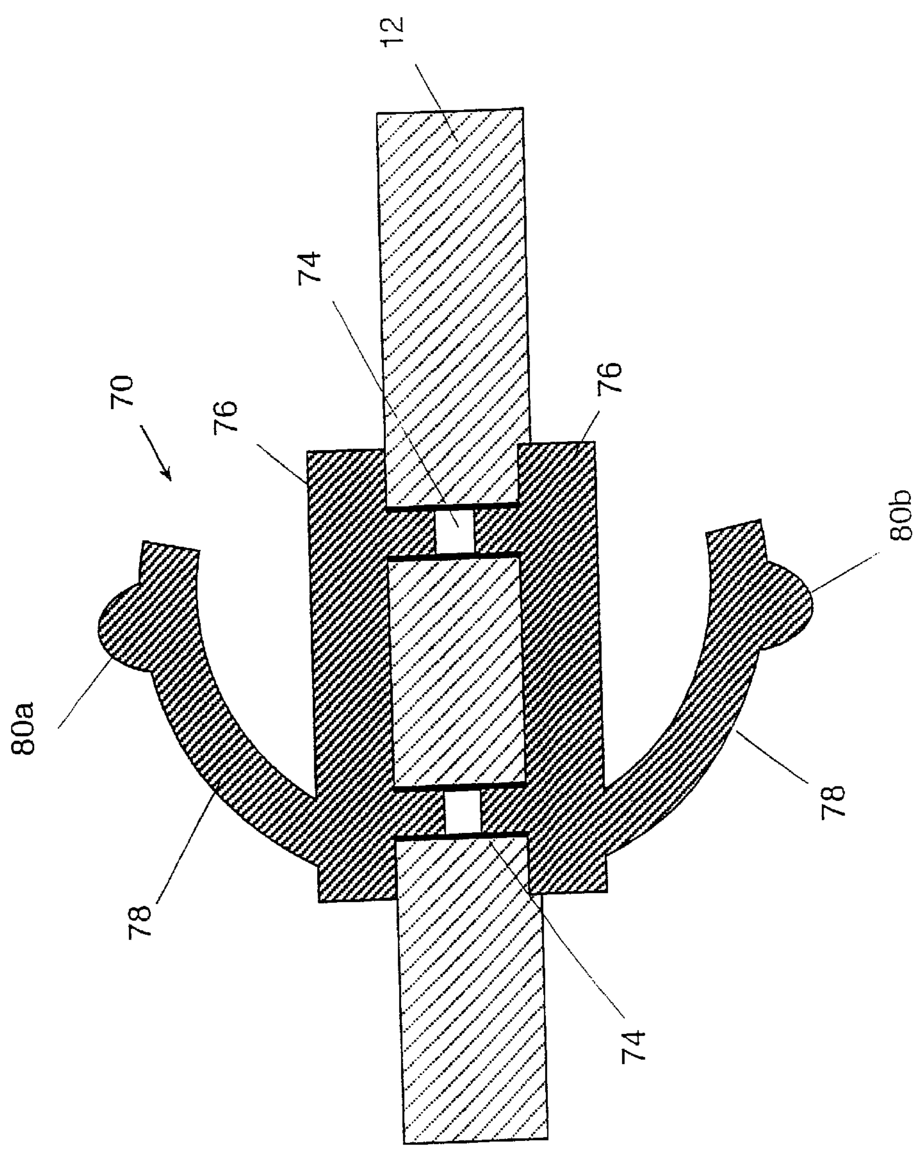
Figure 4C:
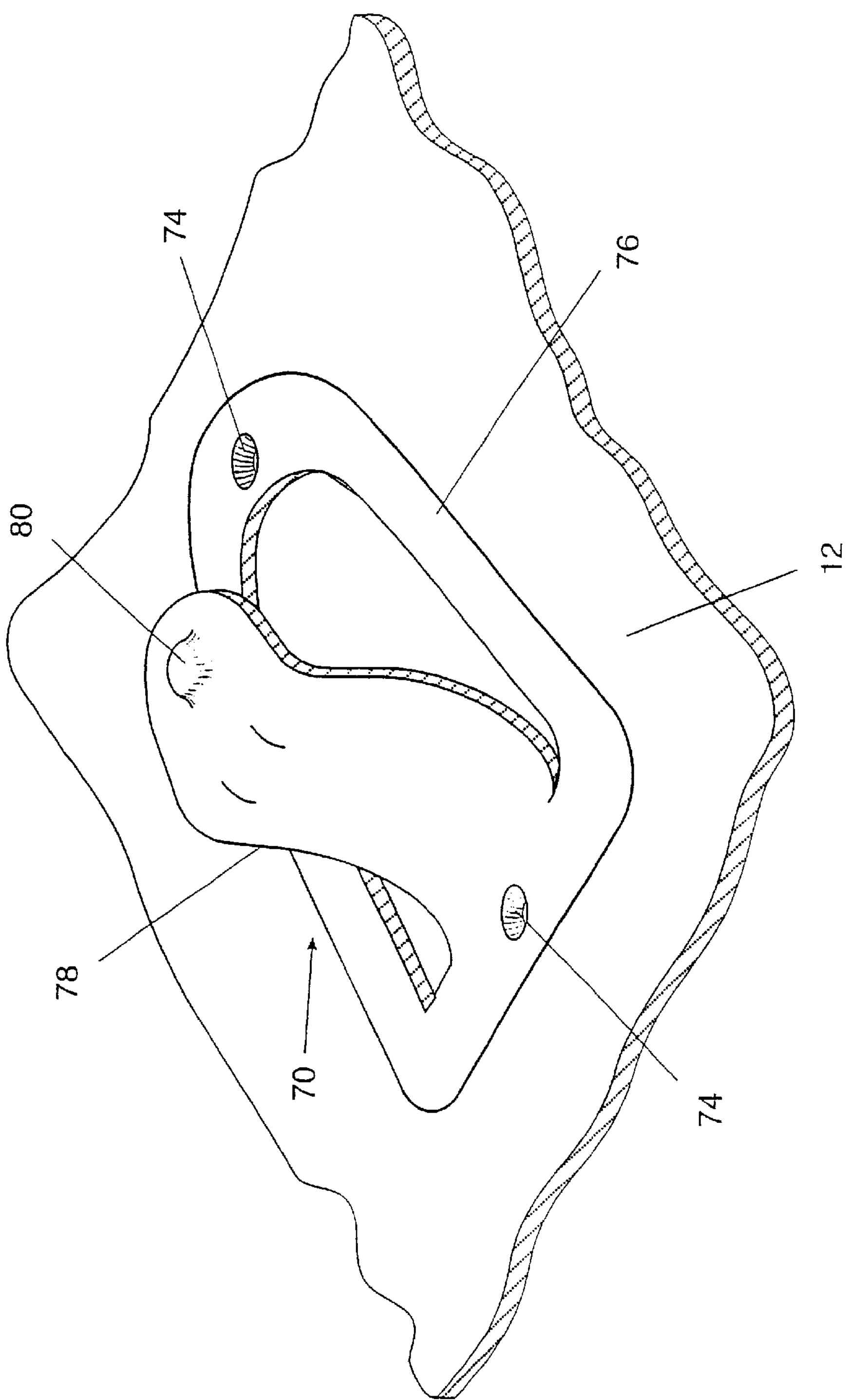

Reference is now made to FIGS. 4A–4C, which illustrate various alternative embodiments of conductive elements 16. For example, FIG. 4A illustrates a conductive element, generally designated 60, based on a vertical coiled spring. Conductive element comprises a central body 62 containing a coil spring 64. At either end of the spring 64 are attached external contact elements 66 and 68 for connecting with contact pads 42 and actuator contact points 46, respectively.

FIGS. 4B and 4C illustrate a conductive element 70 comprising a pair of metallic leaf springs 78, one on either side of isolating board 12 connected by a pair of conducting hole elements 74 as known in the art. As best seen in the isometric view of FIG. 4C, each leaf spring 78 comprises a generally triangular base component 76 on one plane having a tongue element 78 extending from one side of component 76. FIG. 4C shows only the upper part of conductive element 70.

A contact point 80 is attached to the flexible tongue element 78. A pair 70 of flexible elements 78, comprising a conductive element from tip 80*a* to tip 80*b* can be used as a replacement for conductive element 16 to connect in FIG. 1 contact elements 42 and actuator contact points 46, respectively.

What is claimed is:

1. A device for connecting at least two contacts on a first and a second electronic component carrying board, said device comprising:

an isolating board located between said first and said second boards, said board having a plurality of apertures formed therein; and a plurality of conductive elements for connecting, through said apertures, respective contacts on said first and second boards, and wherein at least two of said elements are structurally different from each other.

2. A device according to claim 1, wherein said isolating board further comprises:

a pair of placement apertures located proximate to the outer edges of said isolating board, said pair of placement apertures being dimensionally configured to slidingly receive a corresponding pair of placement pins attached to said second board.

3. A device according to claim 2, wherein said first board comprises a second pair of placement apertures located proximate to the outer edges of said first board, said second pair of placement apertures being dimensionally configured similar to said first pair of placement apertures to slidingly receive said corresponding pair of placement pins attached to said second board.

4. A device according to claim 1, wherein each of said conductive elements comprises an integrally molded element having a generally conical shape having upper and lower truncated cone portions, wherein said upper cone portion has a base having a diameter d1 and an upper contact area having a diameter d2 and wherein said lower cone has a second base having a diameter d3 and a lower contact area having a diameter d4, said plurality of apertures having a diameter W, whereby: W<d4 and W<d3.

5. A device according to claim 1 wherein each of said conductive elements comprises a spring loaded element having contracts on either side.

6. A device according to claim 1, wherein each of said conductive elements comprises a dual leaf spring element having contacts on either side.

7. A device according to claim 1, wherein said first and second boards are brought into contact via the connecting device by application of a pressure plate applied to said first board, wherein the overall dimensions of said pressure plate are at least equivalent to the overall dimensions of said first board.

8. A device according to claim 7, wherein said pressure plate comprises a flexible and heat conducting element suitably attached to the said thereof proximate to said first board.

* * * * *